US012724947B1

(12) United States Patent
Tomei et al.

(10) Patent No.: US 12,724,947 B1
(45) Date of Patent: Sep. 1, 2026

(54) DESIGNING APPROXIMATE ADDER CIRCUITS USING REINFORCEMENT LEARNING

(71) Applicant: Auradine, Inc., Santa Clara, CA (US)

(72) Inventors: Matthew Tomei, Santa Clara, CA (US); Saptadeep Pal, Cupertino, CA (US)

(73) Assignee: Auradine, Inc., Santa Clara, CA (US)

( * ) Notice: Subject to any disclaimer, the term of this patent is extended or adjusted under 35 U.S.C. 154(b) by 668 days.

(21) Appl. No.: 18/217,188

(22) Filed: Jun. 30, 2023

(51) Int. Cl.

| | |
|---|---|
| ***G06F 30/27*** | (2020.01) |
| ***G06F 30/327*** | (2020.01) |
| ***G06F 30/337*** | (2020.01) |
| ***G06F 30/373*** | (2020.01) |
| ***G06N 3/02*** | (2006.01) |
| ***G06N 3/08*** | (2023.01) |

(52) U.S. Cl.
CPC ............ *G06F 30/27* (2020.01); *G06F 30/327* (2020.01); *G06F 30/337* (2020.01); *G06F 30/373* (2020.01); *G06N 3/02* (2013.01); *G06N 3/08* (2013.01)

(58) Field of Classification Search
CPC ...... G06F 30/27; G06F 30/327; G06F 30/337; G06F 30/373; G06N 3/02; G06N 3/08
USPC ..... 716/104, 103, 132, 136; 703/16; 706/12, 706/16, 25, 47
See application file for complete search history.

(56) References Cited

U.S. PATENT DOCUMENTS 9,830,315 B1 * 11/2017 Xiao ...................... G06N 3/045
10,922,611 B2 * 2/2021 Bello ..................... G06N 3/092
11,947,935 B2 * 4/2024 Clement ................ G06N 3/044
(Continued)

FOREIGN PATENT DOCUMENTS

CN 110753936 A * 2/2020 ............... G06N 3/08
CN 114528221 A * 5/2022 ............... G06N 3/04
(Continued)

OTHER PUBLICATIONS

Durbin et al., "A deletion/substitution/addition algorithm for classification neural networks, with applications to biomedical data", www.sciencedirect.com, Journal of Statistical Planning and Inference, No. 138, 2008, pp. 464-488. (Year: 2008).*
Van Hasselt et al., "Deep Reinforcement Learning with Double Q-Learning," #1813, Presented at AAAI-16: Thirtieth AIII Conference on Artificial Intelligence, Phoenix, AZ, USA, Feb. 12-17, 2016, 30(1):2094-2100.
(Continued)

*Primary Examiner* — Phallaka Kik
(74) *Attorney, Agent, or Firm* — Fish & Richardson P.C.

(57) ABSTRACT

Methods, systems, and apparatus, including computer programs encoded on a computer storage medium for designing approximate adder circuits. In one aspect, a method includes: initializing a parallel prefix graph representing a parallel prefix circuit; and for each step in a sequence of steps: obtaining a current state of the parallel prefix graph; processing the current state using a neural network to generate a policy for adding or deleting nodes in the parallel prefix graph; adding or deleting a node in the parallel prefix graph while subject to one or more constraints; synthesizing the parallel prefix circuit having logic circuits corresponding to nodes in the parallel prefix graph; generating a respective value for each of multiple circuit-based metrics; determining a reward based on the values of the circuit-based metrics; and training the network parameters of the neural network on the reward using a reinforcement learning algorithm.

20 Claims, 9 Drawing Sheets

(56) References Cited

U.S. PATENT DOCUMENTS

| | | | | |
|---|---|---|---|---|
| 2018/0336453 | A1* | 11/2018 | Merity | G06N 3/04 |
| 2022/0092386 | A1* | 3/2022 | Zhou | G06N 3/063 |
| 2022/0391678 | A1* | 12/2022 | Zhang | G06N 3/04 |
| 2023/0177337 | A1* | 6/2023 | Desai | G06N 3/092<br>706/25 |
| 2023/0368017 | A1* | 11/2023 | Tolba | G06N 3/0495 |
| 2024/0005129 | A1* | 1/2024 | Zhou | G06N 3/0442 |

FOREIGN PATENT DOCUMENTS

| | | | | |
|---|---|---|---|---|
| DE | 102022128165 | A1 * | 5/2023 | G06N 20/00 |
| DE | 102022210228 | A1 * | 3/2024 | G06N 3/063 |
| EP | 3559868 | B1 * | 5/2025 | G06N 3/0455 |
| EP | 3782082 | B1 * | 11/2025 | G06N 3/08 |
| JP | 7434146 | B2 * | 2/2024 | G06N 3/04 |
| WO | WO-2022098497 | A1 * | 5/2022 | G06N 3/09 |
| WO | WO-2022098504 | A1 * | 5/2022 | G06N 3/045 |

OTHER PUBLICATIONS

Mnih et al., “Human-level control through deep reinforcement learning,” Nature, Feb. 2015, 518(7540):529-33.

Mossalam et al., “Multi-objective deep reinforcement learning,” arXiv, Department of computer Science, University of Oxford, Oxford, United Kingdom, submitted Oct. 9, 2016, 9 pages.

Rosa et al., “AxPPA: Approximate parallel prefix adders,” IEEE Transactions on Very Large Scale Integration (VLSI) Systems, Nov. 21, 2022, 31(1):17-28.

Roy et al., “PrefixRL: Optimization of Parallel Prefix Circuits using Deep Reinforcement Learning,” Presented at the 58th ACM/IEEE Design Automation Conference (DAC), San Francisco, CA, USA, Dec. 5, 2021; available online Nov. 8, 2021, 853-858.

Vilim et al., “Approximate Bitcoin Mining,” Presented at the 53nd ACM/EDAC/IEEE Design Automation Conference (DAC), Austin, TX, USA, Jun. 5, 2016; available one Aug. 18, 2016, 1-6.

* cited by examiner

DESIGNING APPROXIMATE ADDER CIRCUITS USING REINFORCEMENT LEARNING

BACKGROUND

This specification relates to processing data using machine learning models.

Machine learning models receive an input and generate an output, e.g., a predicted output, based on the received input. Some machine learning models are parametric models and generate the output based on the received input and on values of the parameters of the model.

Some machine learning models are deep models that employ multiple layers of models to generate an output for a received input. For example, a deep neural network is a deep machine learning model that includes an output layer and one or more hidden layers that each apply a non-linear transformation to a received input to generate an output.

SUMMARY

This specification describes a machine learning system implemented as computer programs on one or more computers in one or more locations that can design an approximate adder circuit using a neural network trained via a reinforcement learning algorithm. The approximate adder circuit can be configured to process an augend and an addend to generate an approximate sum. For example, the approximate adder circuit can include: (i) a pre-processing circuit configured to process the augend and addend to generate an input sequence of generate and propagate bits, (ii) an approximate parallel prefix circuit configured to perform an approximate prefix computation on the input sequence to generate an output sequence of approximate group generate and propagate bits, and (iii) a post-processing circuit configured to process the output sequence to generate the approximate sum. Using the neural network and graphical representations of the approximate parallel prefix circuit (parallel prefix graphs), the machine learning system can simultaneously optimize multiple circuit-based metrics of the approximate parallel prefix circuit, such as circuit area, computational delay, and/or power consumption, while constraining an error rate of the approximate parallel prefix circuit to below a threshold. These and other aspects are described in more detail below.

According to a first aspect there is provided a method performed by one or more computers for optimizing a parallel prefix circuit configured to process an input sequence to generate an output sequence including, at least approximately, a prefix computation of the input sequence. The method includes: initializing a parallel prefix graph representing the parallel prefix circuit. The parallel prefix graph includes: a respective input and corresponding output at each of multiple bit positions that are arranged from a least significant bit to a most significant bit; and multiple nodes connecting the inputs to the outputs, each node representing a logic circuit that implements an associative operator of the prefix computation, where for each bit position proceeding the least significant bit, the output at the bit position is connected to the input at the bit position and one or more preceding bit positions. The method further includes, for each step in a sequence of steps: obtaining a current state of the parallel prefix graph; processing the current state using a neural network, in accordance with a set of network parameters of the neural network, to determine a policy for adding or deleting nodes in the parallel prefix graph given the current state; adding or deleting a node in the parallel prefix graph using the policy while subject to one or more constraints, where the one or more constraints specify that, when the node is added or deleted, the output at each bit position proceeding a threshold bit position is connected to, at minimum, a threshold number of inputs; synthesizing the parallel prefix circuit having logic circuits corresponding to nodes in the parallel prefix graph; generating a respective value for each of multiple circuit-based metrics of the parallel prefix circuit when synthesized; determining a reward for the step based on the values of the circuit-based metrics at the step; and training the network parameters of the neural network on the reward for the step using a reinforcement learning algorithm.

In some implementations of the method, the threshold bit position is a first threshold bit position; the threshold number of inputs is a first threshold number of inputs, and the one or more constraints further specify that, when the node is added or deleted, the output at each bit position proceeding a second threshold bit position is connected to, at maximum, a second threshold number of inputs. The second threshold number of inputs may be equal to a binary logarithm of a total number of inputs. The total number of inputs may be equal to one of: eight, sixteen, thirty-two, or sixty-four.

In some implementations of the method, the parallel prefix graph is initialized as a Sklansky parallel prefix graph, an approximate Sklansky parallel prefix graph, a Kogge-Stone parallel prefix graph, or an approximate Kogge-Stone parallel prefix graph.

In some implementations of the method, the circuit-based metrics include, at least one of, a circuit area or a computation delay. The circuit-based metrics may further include a power consumption.

In some implementations of the method, determining the reward for the step based on the values of the circuit-based metrics at the step includes: determining the reward for the step based on a difference between: (i) the values of the circuit-based metrics at the step, and (ii) values of the circuit-based metrics at a preceding step.

In some implementations of the method, the reinforcement learning algorithm is a Q-learning algorithm. For example, processing the current state using the neural network, in accordance with the network parameters of the neural network, to determine the policy for adding or deleting nodes in the parallel prefix graph given the current state may include: processing the current state using the neural network, in accordance with the network parameters of the neural network, to generate a Q-value given the current state, where the Q-value characterizes a cumulative measure of rewards that are predicted to be received at each proceeding step if nodes are added or deleted from the parallel prefix graph using the policy at each proceeding step; and determining the policy by maximizing the Q-value. As another example, training the network parameters of the neural network on the reward for the step using the Q-learning algorithm may include: determining gradients of an objective function that depends on the Q-value and the reward at the step; and updating the network parameters of the neural network using the gradients of the objective function.

In some further implementations of the method, the Q-learning algorithm is a double Q-learning algorithm.

In some yet further implementations of the method, the double Q-learning algorithm is a scalarized double Q-learning algorithm.

In some implementations of the method, the logic circuit includes two AND logic gates and an OR logic gate.

In some implementations of the method, each input of the input sequence includes: (i) a respective generate bit, and (ii) a corresponding propagate bit.

In some implementations of the method, each output of the output sequence includes: (i) a respective approximate group generate bit, and (ii) a corresponding approximate group propagate bit.

In some implementations of the method, the neural network is a convolutional neural network.

In some further implementations of the method, the convolutional neural network is in a residual network configuration.

In a second aspect, there is provided a system including one or more non-transitory computer storage media storing instructions that, when executed by one or more computers, cause the one or more computers to perform operations of any of the abovementioned methods.

In a third aspect, there is provided a system including one or more computers and one or more storage devices communicatively coupled to the one or more computers, where the one or more storage devices store instructions that, when executed by the one or more computers, cause the one or more computers to perform operations of the abovementioned methods.

Particular embodiments of the subject matter described in this specification can be implemented so as to realize one or more of the following advantages.

Using the systems and methods disclosed in this specification, arbitrary approximate adders, with different levels of approximation, bit-width, or both, can be generated automatically with near-optimal performance with respect to multiple circuit-based metrics, e.g., area, delay, and/or power. This enables the flexibility for significantly improved adder designs, as the design process is otherwise constrained by manpower since conventional approaches are limited to hand-crafted heuristics for designing new adder circuits for every different level of approximation and/or bit-width. Moreover, since the design space of approximate adders grows exponentially with the bit-width $\mathcal{O}(2^{N^2})$, the number of possible adder topologies becomes intractable to enumerate, thus hand-designed adder circuits and brute force search methods are sub-optimal and/or infeasible for bit-withs of $N \geq 8$. The system and methods disclosed in this specification provide a means of probing this large search space to find optimal approximate adder designs.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
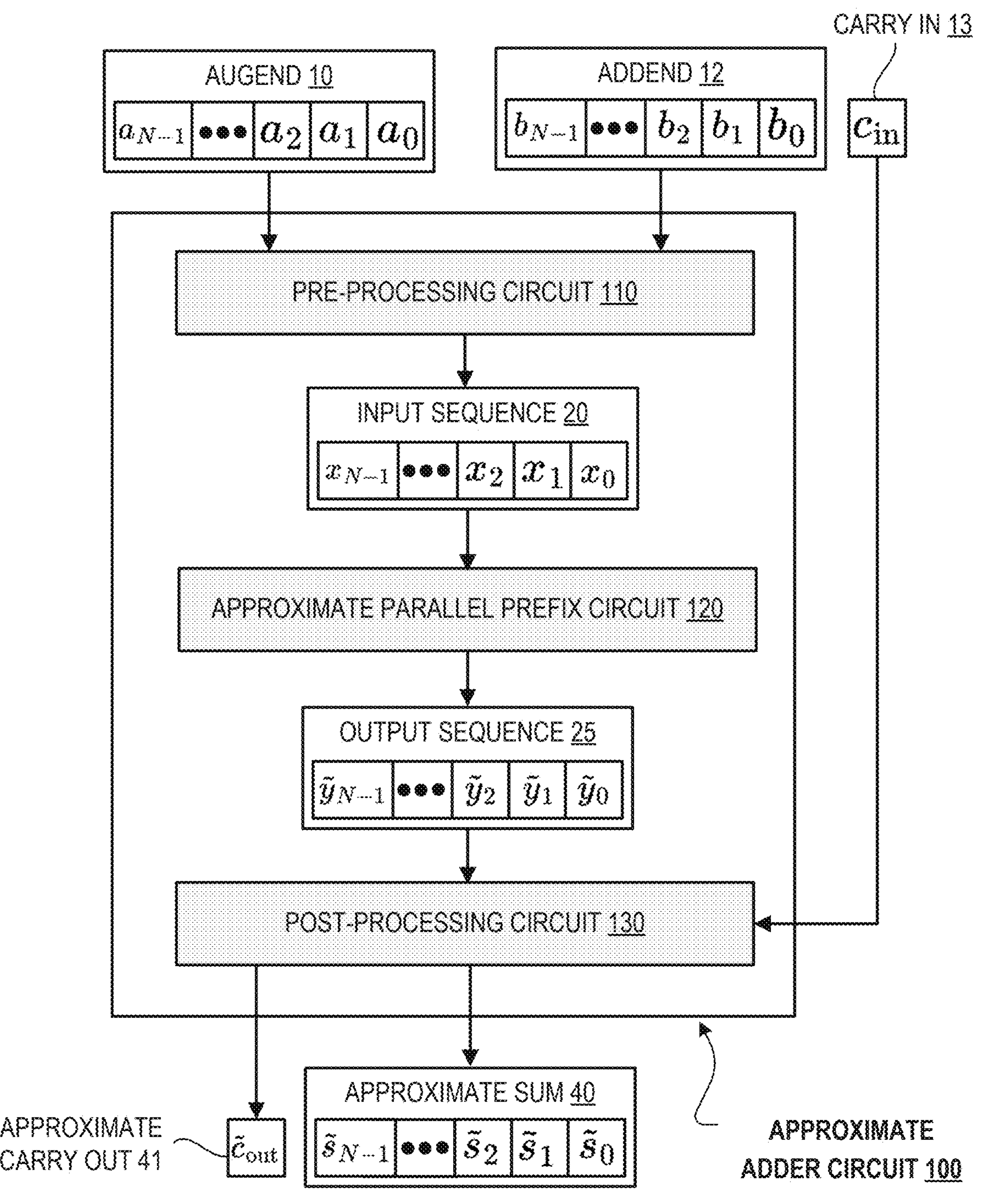
FIG. 1A is a block diagram of an example approximate adder circuit.

Approximate adder circuits (approximate adders) are attractive alternatives to traditional (exact) adders for use in error-tolerant applications such as blockchain hash computations (e.g., for bitcoin or other cryptocurrency mining), machine learning, consumer electronics, computer vision, signal processing, image processing, and video processing, among others. Approximate adders utilize approximate computing methods to increase efficiency across a digital computing stack by trading off a certain level of accuracy for gains in other circuit-based metrics, e.g., area, delay, and/or power. For traditional adders, parallel prefix adders are amongst the fastest, most area-efficient versions and have seen extensive use in high performance digital arithmetic circuits, e.g., multipliers, encoders, multiplexers, etc. However, theoretical research has established lower bounds on the area and delay of N-bit parallel prefix adders (PPAs). The area varies linearly with adder size and the delay varies as $\mathcal{O}(\log_2 N)$. Improving the performance of PPAs is one of the major challenges in digital hardware design but such performance is rapidly approaching these theoretical bounds.

Approximate adders (AxAs), particularly approximate parallel prefix adders (AxPPAs), provide a means of overcoming these bounds as they can sacrifice (some) accuracy for reductions in area, delay, power, and/or fan-out. For example, in traditional PPAs, each output bit depends on all previous input bits so the critical path is determined, at least in part, by the maximum length of a carry propagation chain (N) connecting the least significant input bit to the most significant output bit. AxPPAs described herein can truncate the maximum length M of a carry propagation chain such that each output bit depends, at most, on M inputs bit, e.g., with $M \approx \log_2 N$. This exploits the observation that the critical path is seldom activated in PPAs as a carry propagation chain longer than $\log_2 N$ is, in general, a rare event. Moreover, the AxPPAs described herein can also place a constraint on the minimum length C of a carry propagation chain to provide a bound on their maximum error. This introduces a family of AxPPAs that, when optimized, can outperform traditional PPAs in terms of area, delay, and/or power while still maintaining a high level accuracy. Nevertheless, designing and optimizing AxPPAs is challenging as the design space grows exponentially as $\mathcal{O}(2^{N^2})$ which, for input lengths of N=8, 16, 32, 64, . . . , is intractable to enumerate by brute force methods.

To address some or all of the issues above, this specification introduces a machine learning system that can design AxPPAs using a neural network trained via reinforcement learning. With the help of parallel prefix graphs (PPGs), the machine learning system explores the enormous design space of AxPPAs, which have truncated, variable length carry propagation chains, to determine the digital topology that optimizes multiple circuit-based metrics of the AxPPAs, e.g., area, delay, and/or power. The machine learning system performs this search while imposing constraints on the minimum and maximum lengths of the carry propagation chains to ensure that the retrieved topologies provide a certain target level of accuracy.

These features and other features are described in more detail below.

FIG. 1A is a block diagram of an example N-bit approximate adder circuit 100. The approximate adder (AxA) 100 is an example of a digital arithmetic circuit that can be implemented as multiple interconnected logic gates, e.g., AND, NAND, XAND, OR, NOR, XOR, and/or NOT logic gates. Each logic gate can be fabricated as a combination of one or more transistors, e.g., field-effect transistors (FETs) or bipolar junction transistors (BJTs). Examples of FETs include metal-oxide-semiconductor field-effect transistors (MOSFETs), e.g., CMOS technology, PMOS technology, and/or NMOS technology.

The AxA 100 is configured to perform an approximate summation 101 on an N-bit augend $A=a_{N-1} \ldots a_1a_0$ and an N-bit addend $B=b_{N-1} \ldots b_1b_0$ to generate an N-bit approximate sum $\tilde{S}=\tilde{s}_{N-1} \ldots \tilde{s}_1\tilde{s}_0$. In some implementations, the AxA 100 may also receive a carry in $c_{in}$ and/or generate an approximate carry out $\tilde{c}_{out}$. For ease of description, a tilde over a bit indicates that the bit may be approximate, that is, may have some probability of being erroneous depending on the particular configuration of the AxA 100 and/or particular values of the augend 10 and addend 12. In other words, not all bits with a tilde are approximate, even though they may be referred to as such, as some of these bits may be calculated by the AxA 100 exactly depending on the particular configuration of the AxA 100. For example, the least significant bits in the approximate sum 40, up to some threshold bit position, are usually computed by the AxA 100 exactly as these bits have short carry propagation chains that do not involve truncation. In any case, a bit without a tilde indicates that the bit is exact, assuming no faults in the underlying digital circuitry of the approximate adder 100 after being fabricated.

Figure 1B:
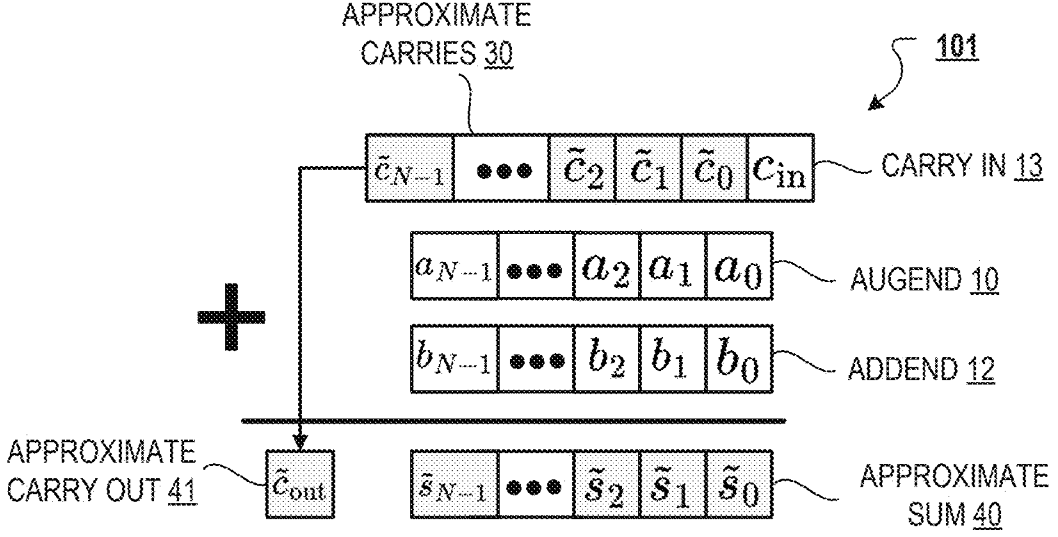
FIG. 1B depicts an approximate summation performed by an approximate adder circuit.

FIG. 1B depicts the approximate summation 101 performed by the AxA 100. At a high level, the AxA 100 computes approximate carries 30 by performing a series of approximate computing operations on the augend 10, the addend 12, and the carry in 13. Thereafter, the AxA 100 computes the approximate sum 40 by combining the augend 10 and addend 12 with the approximate carries 30. Particularly, an approximate sum bit Si, for bit positions $0 \le i \le N-1$, is computed by the AxA 100 as:

$$\tilde{s}_i = (a_i \oplus b_i) \oplus \tilde{c}_{i-1}, \tag{1}$$

where $\oplus$ represents the XOR logic operation and $\tilde{c}_i$ is an approximate carry. In this case, $\tilde{c}_{-1}=c_{in}$ is the carry in 13 and $\tilde{c}_{out}=\tilde{c}_{N-1}$ is the approximate carry out 41. For reference, an exact carry $c_i$ for the i-th bit satisfies a recursion relation of the form:

$$c_i = a_i \cdot b_i + (a_i + b_i) \cdot c_{i-1}, \tag{2}$$

where + represents the OR logic operation and · represents the AND logic operation. As can be seen in the recursion relation of Equation (2), the exact carry for the i-th bit depends on each of the previous augend 10 and addend 12 bits which means a traditional (exact) adder can involve carry propagation chains up to length N. The digital circuitry to compute this propagation chain can involve large area and/or long delays, and is one of the main obstacles for improving performance of traditional adders. However, since carry propagation chains longer than $\log_2 N$ are generally rare events, the AxA 100 can segment the recursion relation one or more times to approximate the carries, which reduces the area and/or delay relative a traditional adder. To do so, the AxA 100 utilizes a parallel prefix structure which also facilitates parallel computation of these segmented recursions.

In more detail, the AxA 100 is an approximate parallel prefix adder (AxPPA) that includes three separate circuits to perform the approximate summation 101: (i) a pre-processing circuit (PrPC) 110, (ii) an approximate parallel prefix circuit (AxPPC) 120, and (iii) a post-processing circuit (PoPC) 130. The PrPC 110 and the PoPC 130 are relatively simple, fixed circuits as they involve computations on signals local to bit positions. The AxPPC 120 involves parallelized computations on signals nonlocal to bit positions; accordingly, performance of the AxA 100 primarily depends on the AxPPC 120. The AxPPC 120 can have numerous different topologies at a desired level of accuracy, with some topologies providing optimized circuit-based metrics, e.g., area, delay, and/or power. The machine learning system described herein is configured to converge to these optimal topologies.

Figure 2A:
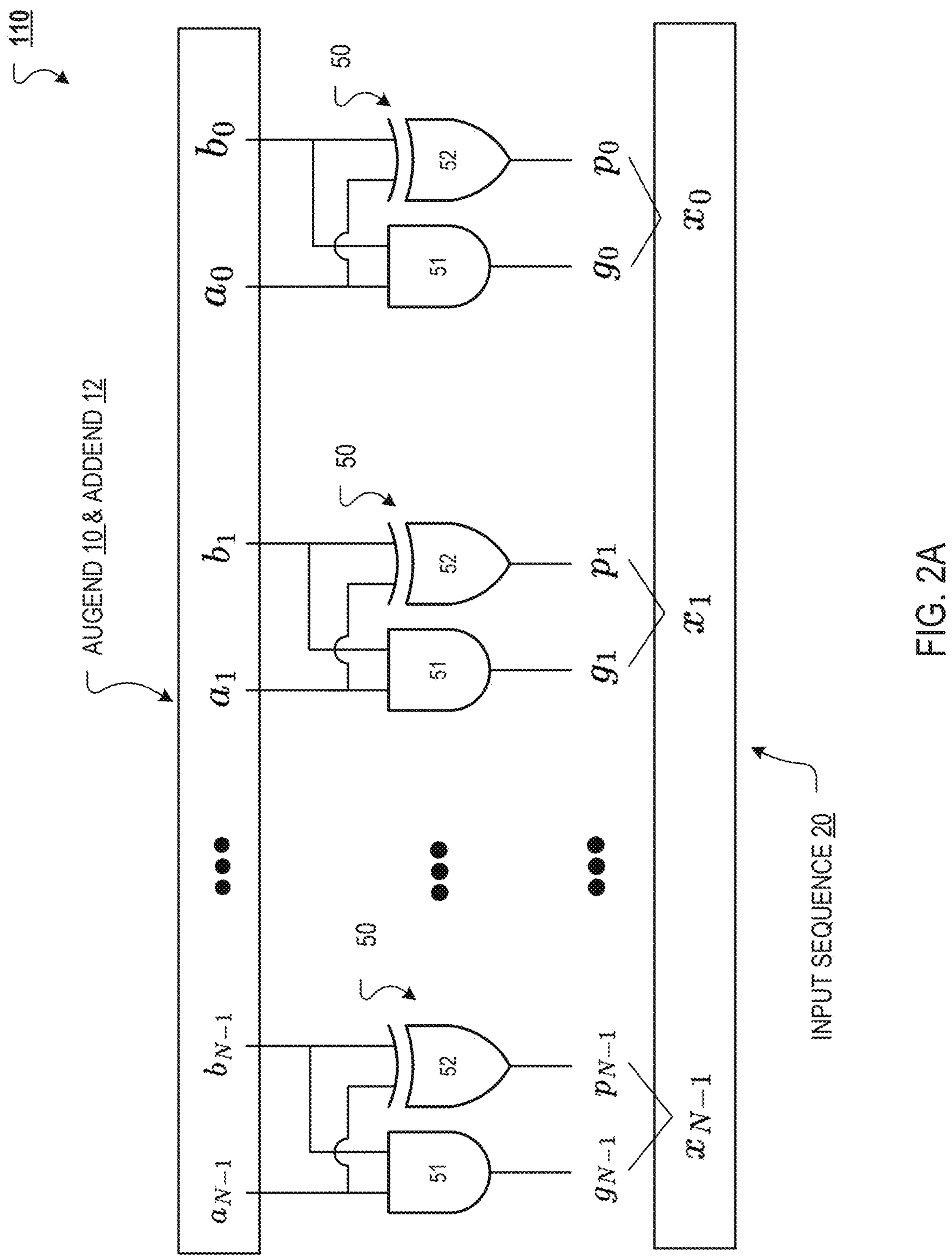
FIG. 2A is a block diagram of an example pre-processing circuit.

FIG. 2A is a block diagram of an example PrPC 110. The PrPC 110 is configured to process the augend 10 and addend 12 to generate an input sequence 20 that can be manipulated efficiently by the AxPPC 120. Each input of the input sequence 20 is a respective tuple $x_i=(g_i, p_i)$ that includes a generate bit $g_i$ and a propagate bit $p_i$. The input sequence 20 includes an input for each bit position $0 \le i \le N-1$. The generate and propagate bits are computed by the PrPC 110 as:

$$g_i = a_i \cdot b_i, \tag{3}$$

$$p_i = a_i \oplus b_i. \tag{4}$$

The condition $g_i=1$ means a carry is generated at the i-th bit, while the condition $p_i=1$ means a carry is propagated through the i-th bit. As seen in FIG. 2A, the PrPC 110 includes multiple logic circuits 50 to generate the output sequence 20 from the augend 10 and addend 12. Each logic circuit 50 is configured to process a respective augend $a_i$ and addend $b_i$ bit to generate the corresponding generate $g_i$ and propagate $p_i$ bits. In this example, each logic circuit 50 includes an AND logic gate 51 and a XOR logic gate 52 to perform the computation. Particularly, each AND logic gate 51 is configured to process a respective augend $a_i$ and addend $b_i$ bit to generate the corresponding generate bit $g_i$, while each XOR logic gate 52 is configured to process the augend $a_i$ and addend $b_i$ bit to generate the corresponding propagate bit $p_i$.

Referring back to FIG. 1A, the AxPPC 120 is configured to process the input sequence 20 to generate an output sequence 25 that is an approximation of a prefix computation of the input sequence 20. Each approximate output of the output sequence 25 is a respective tuple $\tilde{y}_i=(\tilde{G}_i, \tilde{P}_i)$ that includes an approximate group generate bit $\tilde{G}_i$ and an approximate group propagate bit $\tilde{P}_i$. The output sequence 25 includes an approximate output for each bit position $0 \le i \le N-1$. As described in more detail below, the approximate group generate and propagate bits may be truncated in various ways depending on a desired level of accuracy of the AxA 100.

With that in mind, to understand how the AxPPC 120 performs the approximate prefix computation, it is useful to review how a traditional PPC performs an exact prefix computation. The generalized prefix computation involves computing the exact outputs $y_i$ as:

$$y_i = x_i \circ x_{i-1} \circ \ldots \circ x_0, \tag{5}$$

where $\circ$ is a binary associative operator of the prefix computation. The associative operator (or prefix operator) implements the recursion relation in Equation (2), which performs an operation on any two operands $x_i$ and $x_j$ as:

$$x_i \circ x_j = (g_i, p_i) \circ (g_j, p_j) = (g_i + p_i \cdot g_j,\ p_i \cdot p_j). \tag{6}$$

Figure 3A:
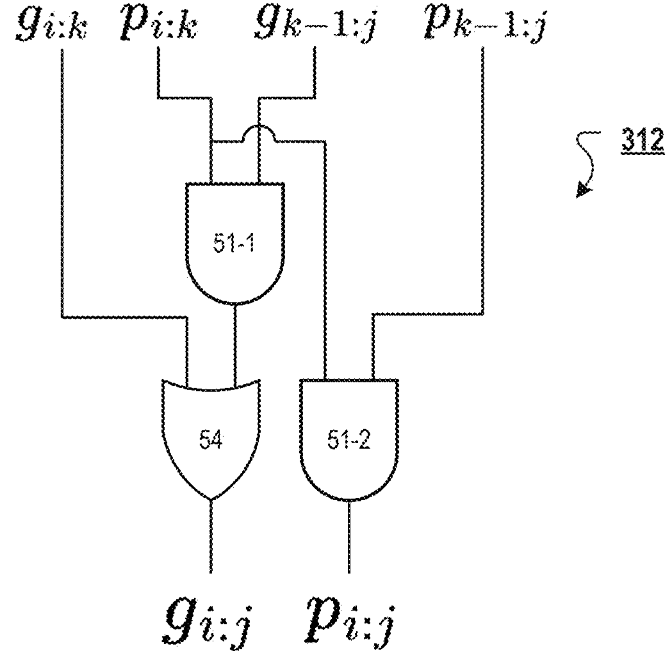
FIG. 3A is a block diagram of an example logic circuit in an approximate parallel prefix circuit.

FIG. 3A shows an example logic circuit 310 that can implement the prefix operator. The logic circuit 310 includes a first AND logic gate 51-1, a second AND logic gate 51-2, and an OR logic gate 54 to perform the operation of Equation (6). With the help of the prefix operator and Equation (6), generate and propagate may be extended to a group of contiguous bits, from bit j to bit i (with i≥j) as follows:

$$x_{i:j} = (g_{i:j}, p_{i:j}) = x_i \circ x_{i-1} \circ \ldots \circ x_j. \tag{7}$$

The condition $g_{i:j}=1$ means a carry is generated in a group of bits from j to i, while the condition $p_{i:j}=1$ means a carry is propagated through the group. Thus, for any particular bit i, the corresponding input $x_i$ is given as:

$$x_i = x_{i:i} = (g_i, p_i), \tag{8}$$

if the group only includes the bit. Similarly, for any particular bit i, the corresponding exact output $y_i$ is computed as:

$$y_i = x_{i:0} = (g_{i:0}, p_{i:0}) = (G_i, P_i), \tag{9}$$

if the group includes each previous bit. Here, $G_i=g_{i:0}$ and $P_i=p_{i:0}$ are the group generate and propagate signals over a group of bits starting from the 0-th bit position and ending at i-th bit position. Moreover, since the prefix operator is associative, the following relation also holds:

$$x_{i:j} = x_{i:k} \circ x_{k-1:j} \tag{10}$$

for i≥k>j. Equation (10) implies that a contiguous group of bits can be decomposed into multiple contiguous subgroups. This allows a traditional PPC to compute groups of generate and propagate bits in parallel and then combine them to compute the exact outputs in Equation (5), thus the term "parallel prefix". Consequently, for any particular bit i, the exact carry for the bit is computed in terms of the group generate $G_i$ and propagate $P_i$ signals of the exact output $y_i$ as:

$$c_i = G_i + P_i c_{in}. \tag{11}$$

Nevertheless, as illustrated in Equations (5) and (9), the exact group generate $G_i$ and propagate $P_i$ bits for the i-th bit depend on i+1 inputs $x_i$ which, even when the prefix computation is parallelized, involves long propagation chains for the most significant bit positions, thus large circuit area and/or long delays. The AxPPC 120 can segment the propagation chains such that only a subset of the group generate and propagate signals are computed, utilizing the observation that propagation chains longer than $\log_2 N$ are rarely activated in traditional PPCs.

Considering Equation (7), for any particular bit position i>0, the AxPPC 120 can use a contiguous group of bits starting from any desired previous bit position $j=K_i$ (instead of j=0) to generate the approximate outputs $\tilde{y}_i$:

$$\tilde{y}_i = x_{i:K_i} = (g_{i:K_i}, p_{i:K_i}) = (\tilde{G}_i, \tilde{P}_i), \tag{12}$$

with $i>K_i\geq 0$. In this way, the AxPPC 120 generates approximate group generate $G_i$ and propagate $\tilde{P}_i$ bits that depend on $N_i=i+1-K_i$ inputs instead of i+1 inputs. Here, $N_i$ are design parameters of the AxPPC 120 that denote the lengths of each approximate output's carry propagation chain, some or all of which can be truncated depending on the configuration of the AxPPC 120. In general, each $N_i$ controls the tradeoff in speed and accuracy when the AxPPC 120 computes the corresponding approximate output $\tilde{y}_i$.

The AxPPC 120 can further constrain the lengths of the propagation chains to be at least as long as a minimum length $N_i\geq C$ and/or at most as long as a maximum length $M\geq N_i$. Here, C denotes the minimum possible length of a propagation chain for bit positions i≥C−1, since bit positions i<C−1 can have smaller propagation chains. Likewise, M denotes the maximum possible length of a propagation chain for bit positions i≥M−1, since bit positions i<M−1 cannot have propagation chains this long. Broadly, these constraints C and M place bounds on the maximum and minimum error rate, respectively, of the AxPPC 120 for different design choices, e.g., for different choices of each $N_i$ and/or different circuit topologies. Hence, C and M define a family of AxPPCs 120 that compute approximate outputs $\tilde{y}_i$ to a certain minimum and maximum level accuracy. The machine learning system disclosed herein optimizes the design of the AxPPC 120 by determining the circuit topology with the best circuit-based metrics, e.g., area, delay, and/or power, while subject to the constraint that each propagation chain of the AxPPC 120 is at least as long as C and/or at most as long as M.

Figure 3B:
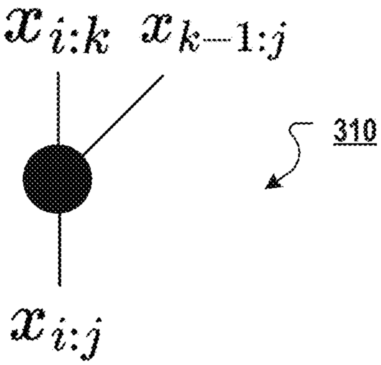
FIG. 3B is a block diagram of an example node in a parallel prefix graph.

However, before proceeding to the description of the machine learning system, it is useful to review how a particular circuit topology of the AxPPC 120 can be represented graphically by a parallel prefix graph (PPG) 400. In general, to perform the approximate prefix computation, the AxPPC 120 can be composed of identical logic circuits 312 (e.g., FIG. 3A) that each implement the associative operator of the prefix computation. Each logic circuit 312 can be represented by a node 310 in a PPG 400 (e.g., FIG. 3B), where the position of the node 310 in the PPG 400 is determined by the indices (i, j) for 1≤i, j≤N−1. Different PPGs 400 may include different numbers of nodes 310 that are interconnected differently but perform the same prefix computation to a certain level of accuracy. Particularly, since a PPG 400 may or may not include a node 310 for each pair of indices (i, j), the design space of possible PPGs 400 for a given input length N goes as $\mathcal{O}(2^{N^2})$, which includes.

Figure 4A:
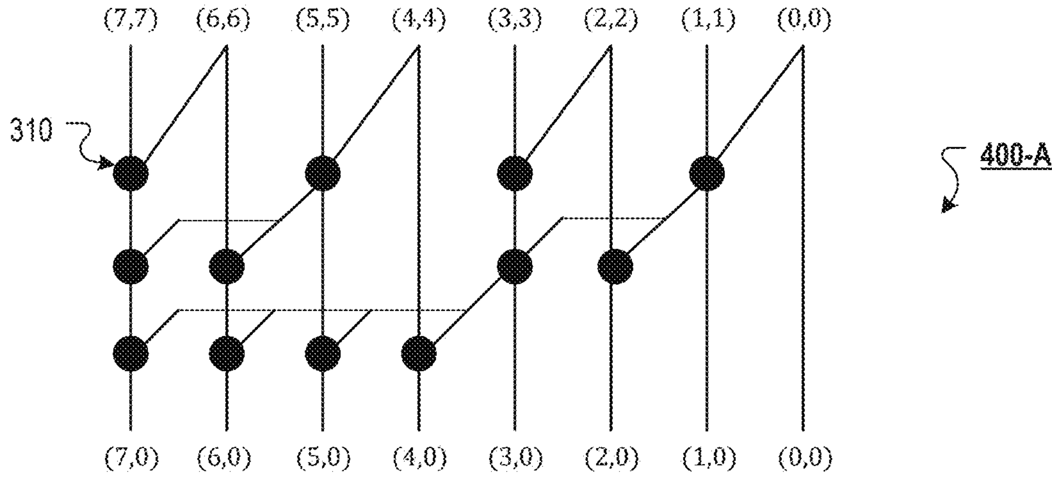
FIGS. 4A-4D are examples of parallel prefix graphs.
Figure 4B:
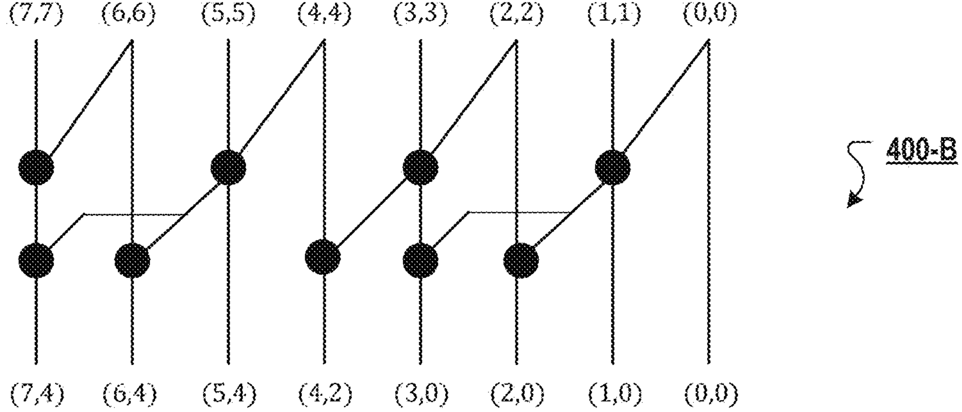
Figure 4C:
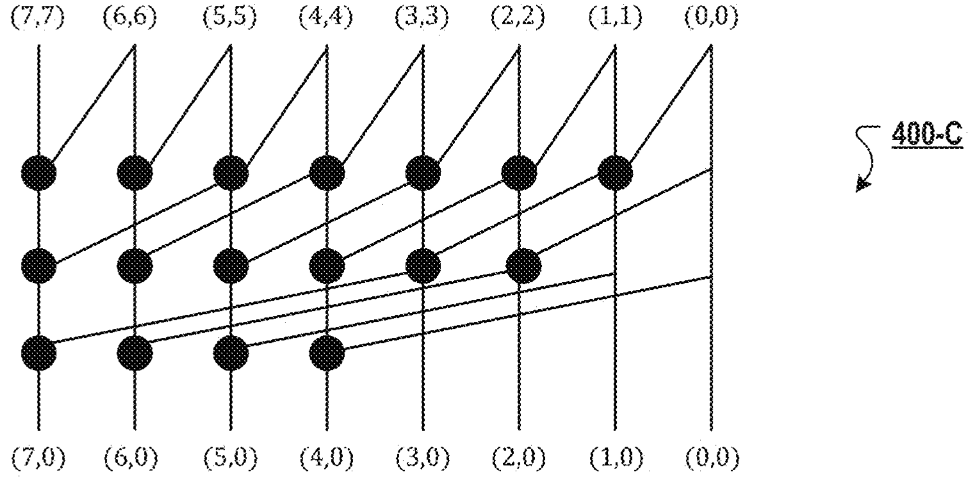
Figure 4D:
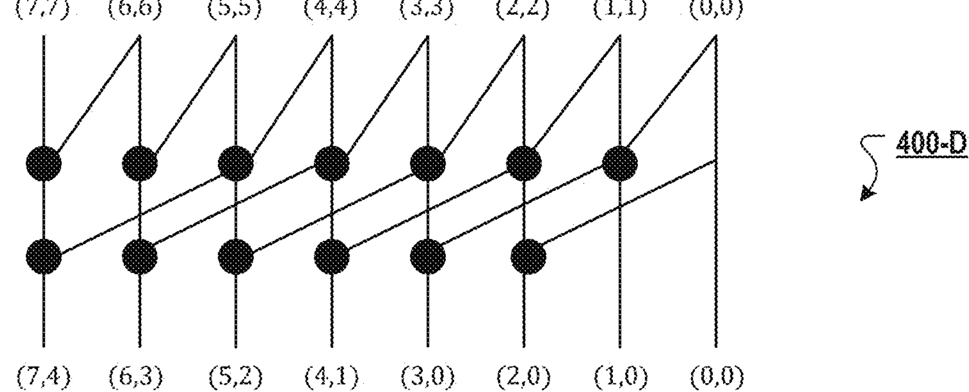

FIGS. 4A-4D show various examples of 8-bit PPGs 400 that can each perform an 8-bit prefix computation to a certain level accuracy. Particularly, FIG. 4A shows an exact Sklansky PPG (SPPG) 400-A, FIG. 4B shows an approximate SPPG (AxSPPG) 400-B, FIG. 4C shows an exact Kogge-Stone PPG (KSPPG) 400-C, and FIG. 4D shows an approximate KSPPG (AxKSPPG) 400-D. As seen in FIGS. 4A-4D, a PPG 400 receives the inputs $x_i=x_{i:i}$ of the input sequence 20 at its top and generates the approximate outputs $y_i=x_{i:K_i}$ of the output sequence 25 at its bottom. The inputs and approximate outputs at each bit position i are arranged from a least significant bit i=0 to a most significant bit i=N−1 along the horizontal. The inputs and approximate outputs are connected by multiple nodes 310, where each node 310 has a fan-in of two and a fan-out of one or more. Each level of nodes 310 along the vertical represents computations performed in parallel. In general, more nodes 310 allow a higher level of parallelization (reduced delay) but at the cost of increased area. That being said, for the same degree of parallelization, nodes 310 can be traded for increased fan-out. For example, the SPPG 400-A and the KSPPG 400-C both have three levels of nodes 310 but the SPPG-400A has a higher fan-out and the KSPPG-400C has a higher number of nodes 310. To reduce the area, delay, and fan-out simultaneously, nodes 310 can be pruned at the cost of some accuracy.

For example, the bottom level of nodes 310 in the SPPG 400-A can be pruned to produce the AxSPPG 400-B with a fan-out of two, reduced area, and reduced delay. As seen in the AxSPPG 400-B, the approximate outputs $\tilde{y}_i=x_{i:K_i}$ at bit positions i=4 to 7 are no longer connected to each previous input $x_i=x_{i:i}$ and therefore have truncated carry propagation chains. For example, the approximate output $\tilde{y}4=x_{4:2}$ at bit position i=4 is connected to inputs $K_4=2$ to i=4 and therefore has a carry chain length of $N_4=3$. As another example, the approximate output $\tilde{y}_5=x_{5:4}$ at bit position i=5 is connected to inputs $K_5=4$ to i=5 and therefore has a carry chain length of $N_5=2$. In this case, the maximum length of a carry chain is M=4 and the minimum length of a carry chain is C=2. In a similar vein, the bottom level of nodes 310 in the KSPPG 400-C can be pruned to produce the AxKSPPG 400-D with reduced area and delay. Here, the maximum length of a carry chain is M=4 and the minimum length of a carry chain is also C=4.

Figure 2B:
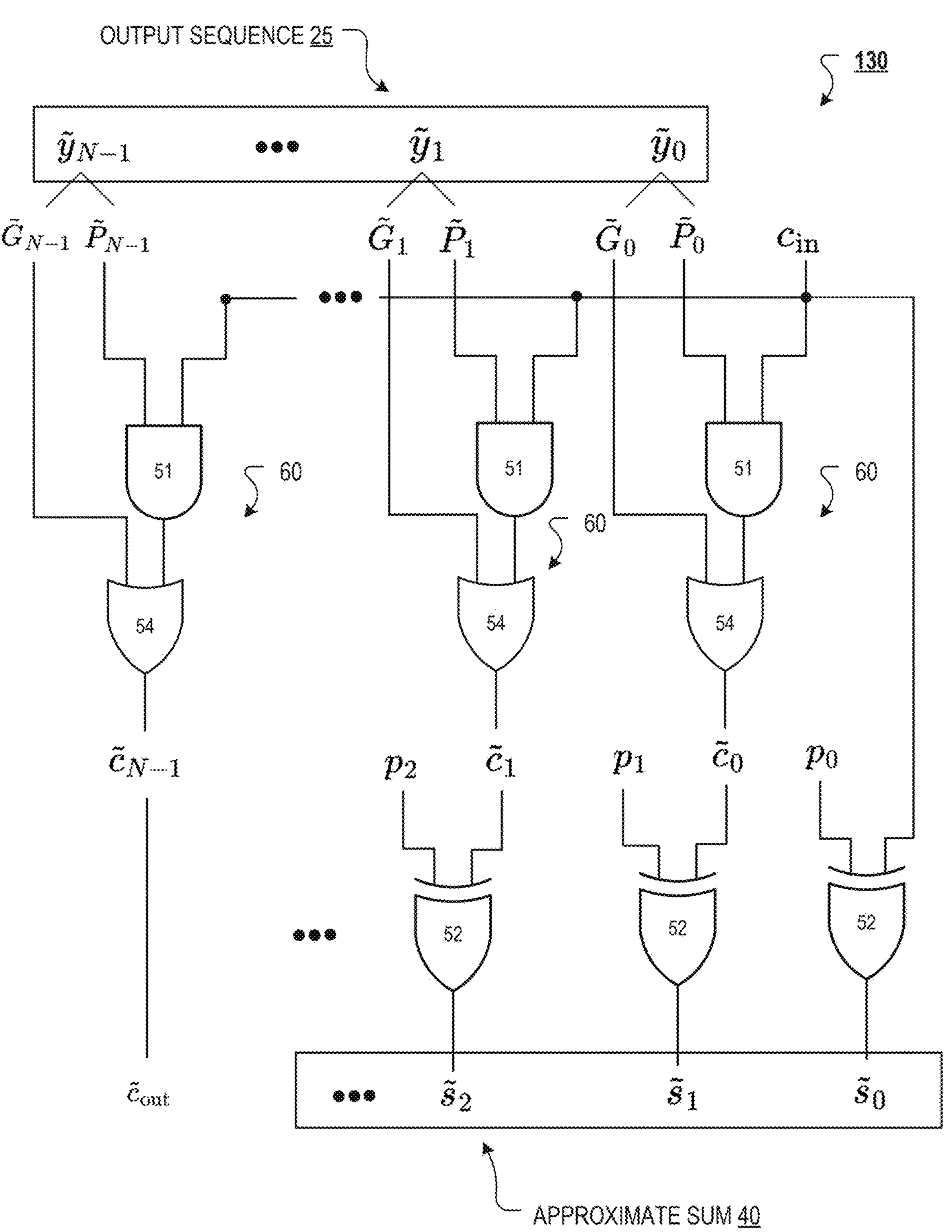
FIG. 2B is a block diagram of an example post-processing circuit.

FIG. 2B is a block diagram of an example PoPC 130. The PoPC 130 is configured to process each approximate output of the output sequence 25, the propagate bits, and the carry in 13 to generate the approximate sum 40 and approximate carry out 41. To do so, the PoPC 130 first computes the approximate carries 30 from the approximate outputs of the output sequence 25 and the carry in 13. An approximate carry for each bit position i is computed by the PoPC 130 as:

$$\tilde{c}_i = \tilde{G}_i + \tilde{P}_i \cdot c_{in}. \tag{13}$$

As seen in FIG. 2B, the PoPC 130 includes multiple logic circuits 60 to generate the approximate carries 30 from the output sequence 25 and carry in 13. Each logic circuit 60 is configured to receive an approximate group generate bit $\tilde{G}_i$, an approximate group propagate bit $\tilde{P}_i$, and the carry in $c_{in}$, and generate the corresponding approximate carry $\tilde{c}_i$. In this example, each logic circuit 60 includes an AND gate 51 and an OR gate 54 to perform the computation.

After computing the approximate carries 30, the PoPC 130 processes the propagate bits generated by the PrPC 110 and generates the approximate sum 40. An approximate sum bit for each bit position i is computed by the PoPC 130 as:

$$\tilde{s}_i = p_i \oplus \tilde{c}_{i-1}, \tag{14}$$

while the approximate carry out 41 is output by the PoPC 130 as $\tilde{c}_{out}=\tilde{c}_{N-1}$. As seen in FIG. 2B, the PoPC 130 includes multiple XOR logic gates 52 to compute the approximate sum 40. Each XOR logic gate 52 is configured to receive a respective propagate bit $p_i$ and approximate carry $\tilde{c}_{i-1}$ (or the carry in 13) and generate the corresponding approximate sum bit $\tilde{s}_i$.

Figure 5:
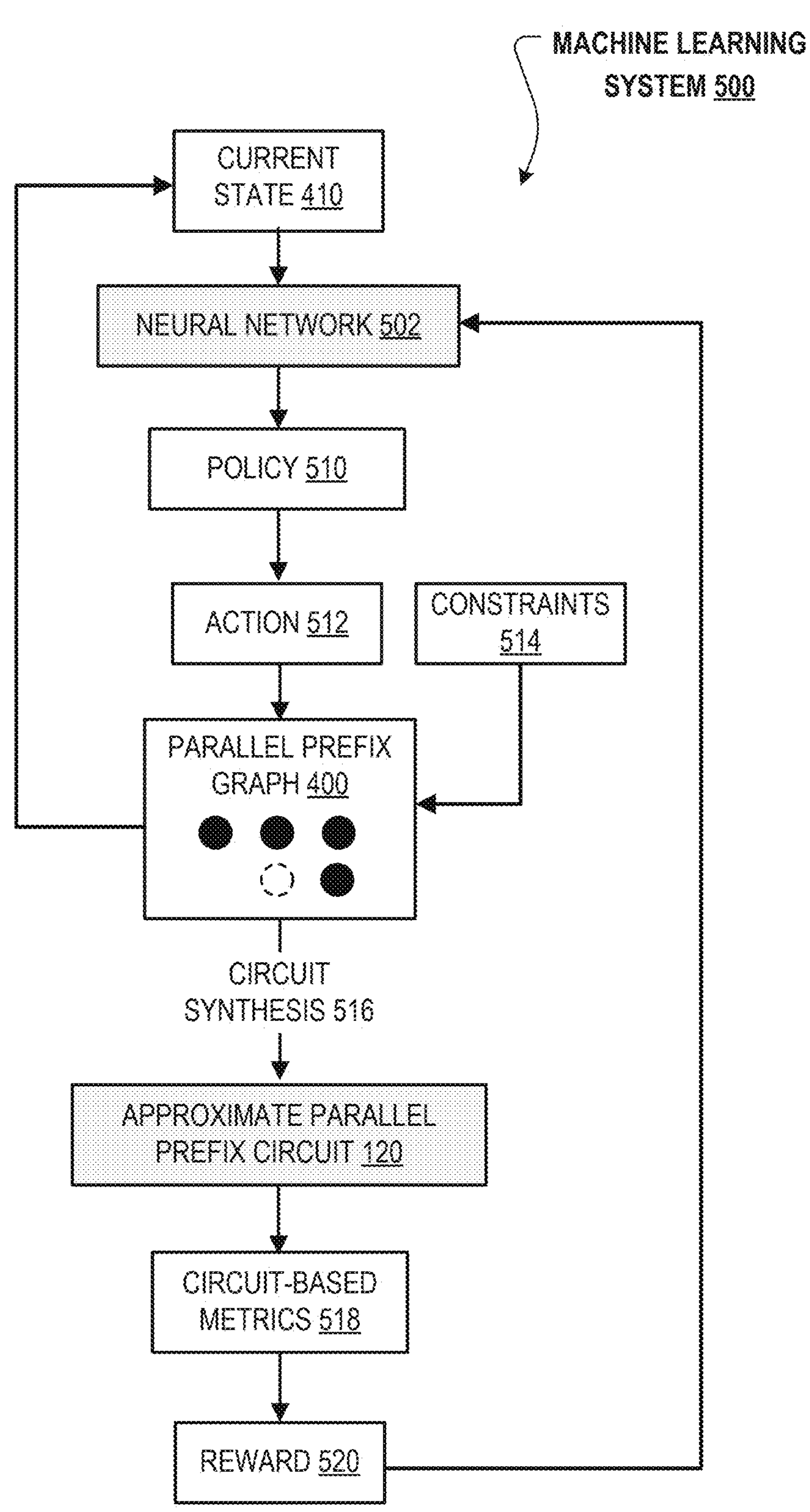
FIG. 5 is a block diagram of an example machine learning system that can optimize an approximate parallel prefix circuit using a neural network trained via a reinforcement learning algorithm.

FIG. 5 shows an example of a machine learning system 500 that can optimize an AxPPC 120 using a neural network 502 trained via a reinforcement learning (RL) algorithm. The machine learning system 500 is an example of a system implemented as computer programs on one or more computers in one or more locations in which the systems, components, and techniques described below are implemented.

The machine learning system 500 frames the design of the AxPPC 120 as a RL task to be performed by an agent. Particularly, the machine learning system 500 formulates the RL task as a Markov Decision Process (MDP) and models the decisions of the agent as a neural network 502 parameterized by a set of network parameters θ. In general, the neural network 502 can include any appropriate types of neural network layers (e.g., fully-connected layers, convolutional layers, attention layers, etc.) in any appropriate numbers (e.g., 5 layers, 25 layers, or 100 layers) and connected in any appropriate configuration (e.g., as a linear sequence of layers).

An MDP can be described by a state space $s\in\mathcal{S}$, an action space $a\in\mathcal{A}$, a transition function $\mathcal{T}$, and a reward function $\mathcal{R}$. In the MDP, an episode evolves over a sequence of discrete steps t=0, 1, 2, . . . where the neural network 502 processes a current state St to determine an action-selection policy $\pi(\cdot|s_t)$, and then selects an action at using the policy $\pi(a_t|s_t)$. The machine learning system 500 provides the neural network 502 with the next state $s_{t+1}=\mathcal{T}(s_t, a_t)$ and a reward $r_t=\mathcal{R}(s_t, a_t)$ based on the current state 410 and selected action 512.

The state space S includes all legal N-bit PPGs 400, where each state s represents a possible digital circuit topology of the AxPPC 120. In particular, each interconnected node 310 in the PPG 400 represents a corresponding logic circuit 312 in the AxPPC 120. The "legal" PPGs 400 are those that, when synthesized as the AxPPC 120, can perform an approximate prefix computation on an input sequence 20 that includes N inputs $x_i$, to generate an output sequence 25 that includes N approximate outputs $\tilde{y}_i$, while subject to one or more constraints 514 that specify the bounds on the error rate in the approximate outputs $\tilde{y}_i$. In particular, the constraints 514 specify that the approximate outputs $\tilde{y}_i$ generated by the AxPPC 120 each have a truncated carry propagation chain $N_i$ that is at least as long as C. In other words, each approximate output after a threshold bit position i≥i'=C−1 depends on no less than C inputs. Thus, C sets the maximum (allowable) error rate of the AxPPC 120. In some implementations, the constraints 514 may further specify that the approximate outputs ỹi generated by the AxPPC 120 each have a truncated carry propagation chain $N_i$ that is at most as long as M. In other words, each approximate output after a (second) threshold bit position i>i"=M−1 depends on no more than M inputs. Thus, M sets the minimum (tolerable) error rate of the AxPPC 120. In these cases, the machine learning system 500 can set this constraint when initializing the PPG 400 at an initial step t=0. For example, the machine learning system 500 can initialize the PPG 400 as an approximate PPG 400, e.g., an AxSPPG or AxKSPPG, having a certain maximum carry propagation length M, such as $M=\log_2 N$, and then perform the search in this restricted design space where each truncated carry propagation chain is at least as long as C and at most as long M.

The action space A includes all actions that can be used to modify a PPG 400 into another PPG 400 while remaining in the state space, where each action a either adds or deletes a node 310 at a particular position in the PPG 400.

In this example, the neural network 502 is a deep Q network (DQN) and the machine learning system 500 uses a Q-learning algorithm to train the neural network 502. In these and other implementations, the neural network 502 can have a convolutional architecture in a residual network configuration. A convolutional architecture allows the neural network 502 to learn in a highly nonlocal manner which is particularly advantageous in this setting due to the nonlocal, parallel computations performed by the AxPPC 120 that the neural network 502 is tasked with designing. A brief overview of Q-learning is described below, while further details are provided by V. Mnih, et al., "Human-level control through deep reinforcement learning," *Nature*, vol. 518, no. 7540, pp. 529-533, 2015.

In a Q-learning algorithm, the neural network 502 is tasked with maximizing a return (cumulative measure of future rewards) by learning an optimal policy π*. The Q-value of a state-action pair ($s_t$, $a_t$) under a policy π is defined as the expected return if the action at is taken at the state St and future actions are taken using the policy 510:

$$Q^{\pi}(s_t, a_t; \theta_t) = \mathbb{E}\left[r_t + \gamma r_{t+1} + \gamma^2 r_{t+2} + \dots\ \right], \quad (15)$$

where γ∈[0,1] is a discount factor that encourages short term rewards over long term ones and $\theta_t$ are the values of the network parameters at the particular step. In general, the policy 510 for Q-learning is defined with respect to the Q-value as $$\pi(\cdot|s_t) = \underset{\alpha}{\operatorname{argmax}} Q(s_t, \alpha; \theta_t),$$

which selects the action with the highest Q-value. Thus, the neural network 502 is configured to process a state s of the PPG 400 as input to generate a Q-value Q(s, a; $\theta_t$) for ∀a∈$\mathcal{A}$ as output, which the neural network 502 then maximizes with respect to the possible actions to determine the policy 510. That being said, the machine learning system 500 can also implement other types of policies, e.g., a ϵ-greedy policy that chooses the action having the highest Q-value with probability 1−ϵ and a random action with probability ϵ∈[0,1], or a softmax-policy that chooses actions at random proportional to their respective Q-values.

In some implementations, the machine learning system 500 uses a double-DQN learning algorithm to train the neural network 502. In this case, the machine learning system 500 introduces a second, target neural network to estimate the Q-values of ($s_{t+1}$, a') that is updated less frequently and samples from an experience replay memory bank. The double DQN-algorithm can improve training of the neural network 502 by reducing overestimations in the Q-values it generates. Further details of the double DQN-algorithm are provided by H. van Hasselt, A. Guez, and D. Silver, "Deep reinforcement learning with double Q-learning," in AAAI'16 *Proceedings of the Thirtieth AAAI Conference on Artificial Intelligence,* 2016, pp. 2094-2100.

An episode begins (at t=0) with the machine learning system 500 initializing the PPG 400 as a randomly chosen PPG 400. For example, the machine learning system 500 can initialize the PPG 400 as a SPPG, an AxSPPG, a KSPPG, or an AxKSPPG similar to those depicted in FIGS. 4A-4D. Note, the initialized PPG can be an exact PPG since the neural network 502 will eventually converge to an approximate PPG as the episode proceeds. This is because such approximate PPGs generally correspond to better circuit-based metrics 518, e.g., reduced area, reduced delay, and/or reduced power, than exact PPGs. As shown below in Equation (16), the neural network 502 is encouraged to pursue these approximate PPGs based on the type of received rewards 520.

At each step, the machine learning system 500 processes the current state 410 using the neural network 502 to determine a policy 510. The machine learning system 500 then applies an action 512 using the policy 510. Each action 512 modifies the PPG $s_t$ to another, legal PPG $s_{t+1}$ and a reward 520 is determined:

$$r_t = [A(s_t) - A(s_{t+1}),\ D(s_t) - D(s_{t+1})], \quad (16)$$

where A(s) and D(s) denote the values of the area and delay of a particular state s of the PPG 400 when synthesized as the AxPPC 120. As seen in Equation (16), the reward 520 is calculated by the machine learning system 500 based on a difference between the values of circuit-based metrics 518 for the current state $s_t$ and the next, modified state $s_{t+1}$. Here, the circuit-based metrics 518 include circuit area and computational delay but these can also include power consumption. In this case, the reward 520 indicates the decrease in the normalized circuit area and computational delay when the PPG 400 is modified from $s_t$ to $s_{t+1}$. Details of how the machine learning system 500 measures area and delay are described in more detail below. In this example, as seen in Equation (16), the reward 520 is a vector that includes a reward component for each circuit-based metric 518. In other implementations, the reward 520 can be a scalar reward that includes a weighted combination of the circuit-based metrics 518, e.g., $r_t = w^T r_t = w_A[A(s_t) - A(s_{t+1})] + w_D[D(s_t) - D(s_{t+1})]$, where $w=[w_A, w_D]$ is a vector of weights $w_A>0$ and $w_D>0$ that, respectively, normalize the units of the area and delay values.

That being said, with competing circuit-based metrics 518 such as area and delay, the same improvement in a scalar reward can occur from a reduction in either area or delay, but the resulting PPG 400 may be quite different. A scalarized Q-learning algorithm can help the neural network 502 deduce how certain actions affect the PPG 400 with respect to each circuit-based metric 518. Further details of the scalarized Q-learning algorithm are provided by H. Mossalam, Y. M. Assael, D. M. Roijers, and S. Whiteson, "Multi-objective deep reinforcement learning." *arXiv preprint arXiv:* 1610.02707, 2016. In this case, the neural network 502 can be configured to process a state of the PPG 40 as input to generate a vector Q-value $Q(s, a; \theta_t)=[Q_A(s, a; \theta_t), Q_D(s, a; \theta_t)]$ as output, such that each component of the Q-value corresponds to a component of the reward 520. The machine learning system 500 can then determine a policy 510 after scalarizing the vector Q-value with a weight vector $Q(s, a; \theta_t)=w^T Q(s, a; \theta_t)$. For example, in a scalarized double-DQN learning algorithm, the target $z_t$, objective function L, and policy $\pi$ for a given step in an episode can be expressed as:

$$z_t = r_t + \gamma Q\left(s_{t+1}, \underset{a}{\operatorname{argmax}} w^T Q(s_{t+1}, a; \theta_t); \theta_t'\right), \quad (17)$$

$$L(z_t, Q(s_t, a; \theta_t)), \quad (18)$$

$$\pi(\cdot|s_t) = \underset{a}{\operatorname{argmax}} w^T Q(s_t, a; \theta_t), \quad (19)$$

where $\theta_t$ and $\theta'_t$ are, respectively, the network parameters of the neural network 502 and the target neural network at the step t. In general, the objective function characterizes an error between the target $z_t$ and the predicted Q-value generated by the neural network 502. For example, the objective function can be a mean-squared error function or other appropriate error metric. To train the neural network 502 at each step in an episode, the machine learning system 500 can determine gradients of the objective function L and then use the gradients to update the network parameters of the neural network 502. For example, the machine learning system 500 can use a stochastic gradient descent method such as Adam, RMSProp, Momentum, AdaGrad, or other appropriate optimization technique. The machine learning system 500 can use a similar procedure to update the network parameters of the target neural network, but less frequently, e.g., after a particular interval of steps, e.g., 5, 10, 20, 50, 100 steps etc.

To determine the circuit-based metrics 518 for a particular state $s_t$ of the PPG 400, the machine learning system 500 synthesizes the AxPPC 120 corresponding to the state, such that nodes 310 in the PPG 400 correspond to logic circuits 312 in the AxPPC 120. For example, the machine learning system 500 can use the OpenPhySyn physical synthesis tool to perform physical circuit synthesis 516, e.g., by generating a gate level netlist and applying timing-driven synthesis optimizations at multiple delay targets. Such optimizations can include gate sizing, gate cloning, buffer insertion, and pin swapping. After synthesis optimization, the machine learning system 500 can interpolate an area-delay tradeoff curve, e.g., using PChip Interpolation, to determine the corresponding area and delay metrics.

Figure 6:
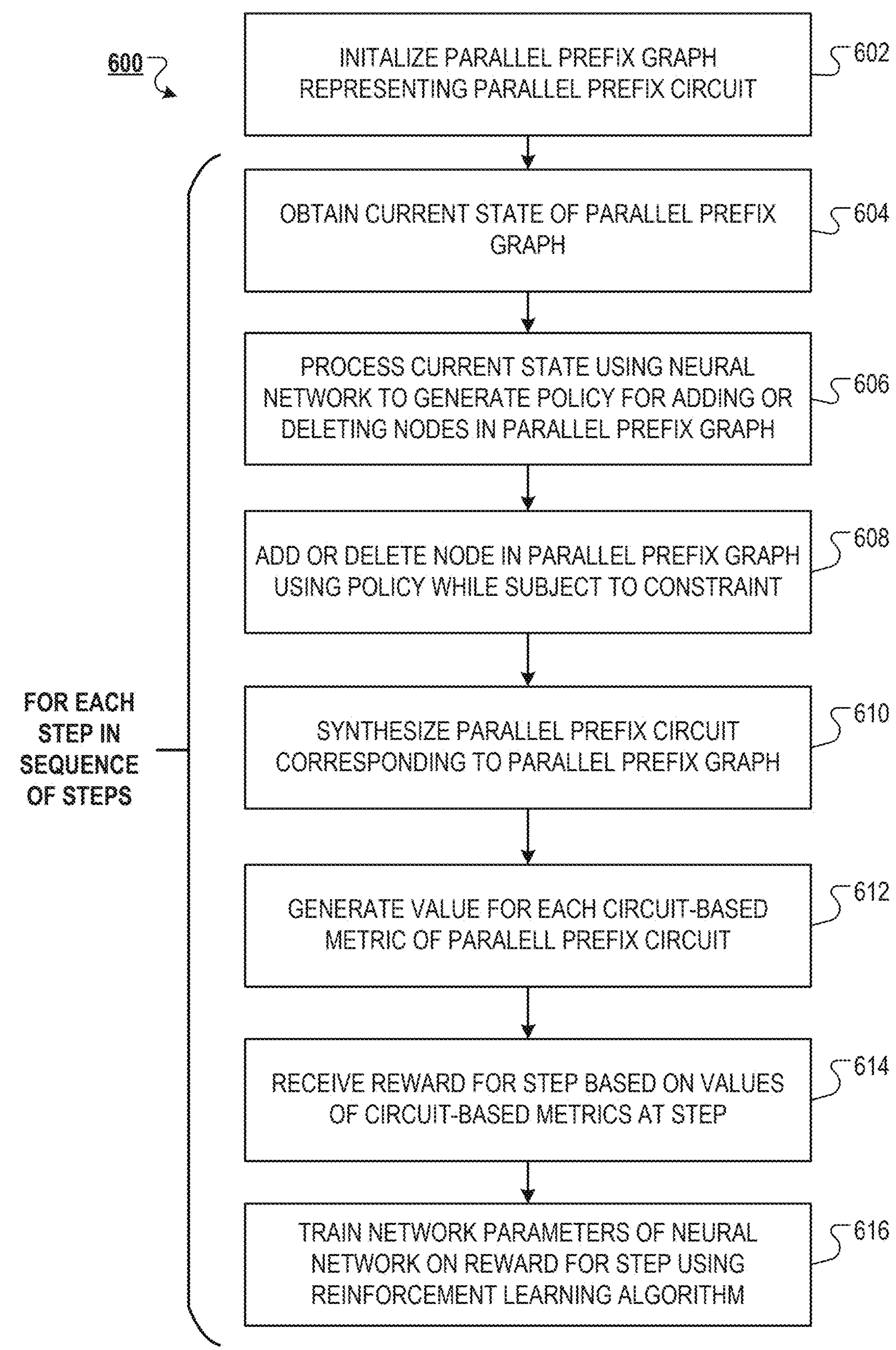
FIG. 6 is a flow diagram of an example process for optimizing an approximate parallel prefix circuit using a neural network trained via a reinforcement learning algorithm.

FIG. 6 is a flow diagram of an example process for optimizing an approximate parallel prefix circuit using a neural network trained via a reinforcement learning algorithm. For convenience, the process 600 will be described as being performed by a system of one or more computers located in one or more locations. For example, a machine learning system, e.g., the machine learning system 500 of FIG. 5, appropriately programmed in accordance with this specification, can perform the process 600.

The approximate parallel prefix circuit (e.g., FIG. 1A) is configured to process an input sequence to generate an output sequence that includes, at least approximately, a prefix computation of the input sequence. The input and output sequences can be of any desired bit-width N.

The machine learning system initializes a parallel prefix graph representing the approximate parallel prefix circuit (602).

For example, the machine learning system can initialize the parallel prefix graph as a Sklansky parallel prefix graph (e.g., FIG. 4A), an approximate Sklansky parallel prefix graph (e.g., FIG. 4B), a Kogge-Stone parallel prefix graph (e.g., FIG. 4C), or an approximate Kogge-Stone parallel prefix graph (e.g., FIG. 4D).

The parallel prefix graph includes a respective input $x_i$ and corresponding approximate output $\tilde{y}_i$ at each of multiple bit positions i. The bit positions are arranged from a least significant bit i=0 to a most significant bit i=N−1. The parallel prefix graph includes multiple nodes (e.g., FIG. 3B) connecting the inputs to the approximate outputs. Each node represents a logic circuit (e.g., FIG. 3A) that implements an associative operator $\circ$ of the prefix computation. For each bit position i proceeding the least significant bit i=0, the approximate output $\tilde{y}_i=x_{i:K_i}$ at the bit position is connected to the input $x_i$ at the bit position and one or more preceding bit positions $i>K_i\geq 0$.

For each step t in a sequence of steps t=0, 1, 2, . . . the machine learning system performs the following operations.

The machine learning system obtains a current state $s_t$ of the parallel prefix graph (604). For example, the current state can indicate, at the current time step, the presence or absence of a node at each possible position in the parallel prefix graph.

The machine learning system processes the current state $s_t$ using the neural network, in accordance with a set of network parameters of the neural network, to determine a policy $\pi(\bullet|s_t)$ for adding or deleting nodes in the parallel prefix graph given the current state $s_t$ (606). In some implementations, the reinforcement learning algorithm is a Q-learning algorithm. In these cases, the machine learning system can process the current state using the neural network, in accordance with the network parameters of the neural network, to generate a Q-value given the current state. The Q-value characterizes a cumulative measure of rewards that are predicted to be received at each proceeding step if nodes are added or deleted from the parallel prefix graph using the policy at each proceeding step. The machine learning system can then determine the policy by maximizing the Q-value.

The machine learning system adds or deletes a node in the parallel prefix graph using the policy while subject to one or more constraints. The one or more constraints specify that, when the node is added or deleted, the approximate output at each bit position i proceeding a threshold bit position i' is connected to, at minimum, a threshold number of inputs C (608). For example, the threshold bit position can be equal to i'=C−1.

In some implementations, the threshold bit position is a first threshold bit position, the threshold number of inputs is a first threshold number of inputs, and the one or more constraints further specify that, when the node is added or deleted, the approximate output at each bit position i proceeding a second threshold bit position i" is connected to, at maximum, a second threshold number of inputs M. For example, the second threshold bit position can be equal to i"=M−1.

The machine learning system synthesizes the approximate parallel prefix circuit having logic circuits corresponding to nodes in the parallel prefix graph (610).

The machine learning system determines a respective value for each of multiple circuit-based metrics of the parallel prefix circuit when synthesized (612)

The machine learning system determines a reward for the step based on the values of the circuit-based metrics at the step (614). In some implementations, the machine learning system determines the reward for the step based on a difference between: (i) the values of the circuit based-metrics at the step, and (ii) values of the circuit-based metrics at a previous step.

The machine learning system trains the network parameters of the neural network on the reward for the step using the reinforcement learning algorithm (616). For example, if the reinforcement learning algorithm is a Q-learning algorithm, the machine learning system can determine gradients of an objective function that depends on a Q-value and the reward at the step. The machine learning system can then update the network parameters of the neural network using the gradients of the objective function.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

In this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method performed by one or more computers for optimizing a parallel prefix circuit configured to process an input sequence to generate an output sequence comprising, at least approximately, a prefix computation of the input sequence, the method comprising:

initializing a parallel prefix graph representing the parallel prefix circuit, the parallel prefix graph comprising:

a respective input and corresponding output at each of a plurality of bit positions that are arranged from a least significant bit to a most significant bit; and a plurality of nodes connecting the inputs to the outputs, each node representing a logic circuit that implements an associative operator of the prefix computation, wherein for each bit position proceeding the least significant bit, the output at the bit position is connected to the input at the bit position and one or more preceding bit positions; and for each step in a sequence of steps:

obtaining a current state of the parallel prefix graph;

processing the current state using a neural network, in accordance with a set of network parameters of the neural network, to determine a policy for adding or deleting nodes in the parallel prefix graph given the current state;

adding or deleting a node in the parallel prefix graph using the policy while subject to one or more constraints, wherein the one or more constraints specify that, when the node is added or deleted, the output at each bit position proceeding a threshold bit position is connected to, at minimum, a threshold number of inputs;

synthesizing the parallel prefix circuit having logic circuits corresponding to nodes in the parallel prefix graph;

generating a respective value for each of a plurality of circuit-based metrics of the parallel prefix circuit when synthesized;

determining a reward for the step based on the values of the circuit-based metrics at the step; and training the network parameters of the neural network on the reward for the step using a reinforcement learning algorithm.

2. The method of claim 1, wherein:

the threshold bit position is a first threshold bit position;

the threshold number of inputs is a first threshold number of inputs, and the one or more constraints further specify that, when the node is added or deleted, the output at each bit position proceeding a second threshold bit position is connected to, at maximum, a second threshold number of inputs.

3. The method of claim 2, wherein the second threshold number of inputs is equal to a binary logarithm of a total number of inputs.

4. The method of claim 3, where the total number of inputs is equal to one of: eight, sixteen, thirty-two, or sixty-four.

5. The method of claim 1, wherein the parallel prefix graph is initialized as a Sklansky parallel prefix graph, an approximate Sklansky parallel prefix graph, a Kogge-Stone parallel prefix graph, or an approximate Kogge-Stone parallel prefix graph.

6. The method of claim 1, wherein the circuit-based metrics comprise, at least one of, a circuit area or a computation delay.

7. The method of claim 6, wherein the circuit-based metrics further comprise a power consumption.

8. The method of claim 1, wherein determining the reward for the step based on the values of the circuit-based metrics at the step comprises:

determining the reward for the step based on a difference between: (i) the values of the circuit-based metrics at the step, and (ii) values of the circuit-based metrics at a preceding step.

9. The method of claim 1, wherein the reinforcement learning algorithm is a Q-learning algorithm.

10. The method of claim 9, wherein processing the current state using the neural network, in accordance with the network parameters of the neural network, to determine the policy for adding or deleting nodes in the parallel prefix graph given the current state comprises:

processing the current state using the neural network, in accordance with the network parameters of the neural network, to generate a Q-value given the current state, wherein the Q-value characterizes a cumulative measure of rewards that are predicted to be received at each proceeding step if nodes are added or deleted from the parallel prefix graph using the policy at each proceeding step; and determining the policy by maximizing the Q-value.

11. The method of claim 10, wherein training the network parameters of the neural network on the reward for the step using the Q-learning algorithm comprises:

determining gradients of an objective function that depends on the Q-value and the reward at the step; and updating the network parameters of the neural network using the gradients of the objective function.

12. The method of claim 9, wherein the Q-learning algorithm is a double Q-learning algorithm.

13. The method of claim 12, wherein the double Q-learning algorithm is a scalarized double Q-learning algorithm.

14. The method of claim 1, wherein the logic circuit comprises two AND logic gates and an OR logic gate.

15. The method of claim 14, wherein each input of the input sequence comprises: (i) a respective generate bit, and (ii) a corresponding propagate bit.

16. The method of claim 15, wherein each output of the output sequence comprises: (i) a respective approximate group generate bit, and (ii) a corresponding approximate group propagate bit.

17. The method of claim 1, wherein the neural network is a convolutional neural network.

18. The method of claim 17, wherein the convolutional neural network is in a residual network configuration.

19. One or more non-transitory computer storage media storing instructions that, when executed by one or more computers, cause the one or more computers to perform operations of a method for optimizing a parallel prefix circuit configured to process an input sequence to generate an output sequence comprising, at least approximately, a prefix computation of the input sequence, the method comprising:

initializing a parallel prefix graph representing the parallel prefix circuit, the parallel prefix graph comprising:

a respective input and corresponding output at each of a plurality of bit positions that are arranged from a least significant bit to a most significant bit; and a plurality of nodes connecting the inputs to the outputs, each node representing a logic circuit that implements an associative operator of the prefix computation, wherein for each bit position proceeding the least significant bit, the output at the bit position is connected to the input at the bit position and one or more preceding bit positions; and for each step in a sequence of steps:

obtaining a current state of the parallel prefix graph;

processing the current state using a neural network, in accordance with a set of network parameters of the neural network, to determine a policy for adding or deleting nodes in the parallel prefix graph given the current state;

adding or deleting a node in the parallel prefix graph using the policy while subject to one or more constraints, wherein the one or more constraints specify that, when the node is added or deleted, the output at each bit position proceeding a threshold bit position is connected to, at minimum, a threshold number of inputs;

synthesizing the parallel prefix circuit having logic circuits corresponding to nodes in the parallel prefix graph;

generating a respective value for each of a plurality of circuit-based metrics of the parallel prefix circuit when synthesized;

determining a reward for the step based on the values of the circuit-based metrics at the step; and training the network parameters of the neural network on the reward for the step using a reinforcement learning algorithm.

20. A system comprising one or more computers and one or more storage devices communicatively coupled to the one or more computers, wherein the one or more storage devices store instructions that, when executed by the one or more computers, cause the one or more computers to perform operations of a method for optimizing a parallel prefix circuit configured to process an input sequence to generate an output sequence comprising, at least approximately, a prefix computation of the input sequence, the method comprising:

initializing a parallel prefix graph representing the parallel prefix circuit, the parallel prefix graph comprising:

a respective input and corresponding output at each of a plurality of bit positions that are arranged from a least significant bit to a most significant bit; and a plurality of nodes connecting the inputs to the outputs, each node representing a logic circuit that implements an associative operator of the prefix computation, wherein for each bit position, the output at the bit position is connected to the input at the bit position and one or more preceding bit positions; and for each step in a sequence of steps:

obtaining a current state of the parallel prefix graph;

processing the current state using a neural network, in accordance with a set of network parameters of the neural network, to determine a policy for adding or deleting nodes in the parallel prefix graph given the current state;

adding or deleting a node in the parallel prefix graph using the policy while subject to one or more constraints, wherein the one or more constraints specify that, when the node is added or deleted, the output at each bit position proceeding a threshold bit position is connected to, at minimum, a threshold number of inputs;

synthesizing the parallel prefix circuit having logic circuits corresponding to nodes in the parallel prefix graph;

generating a respective value for each of a plurality of circuit-based metrics of the parallel prefix circuit when synthesized;

determining a reward for the step based on the values of the circuit-based metrics at the step; and training the network parameters of the neural network on the reward for the step using a reinforcement learning algorithm.

* * * * *